United States Patent
Zeller (10) Patent No.: US 10,761,168 B2
(45) Date of Patent: Sep. 1, 2020

(54) SIMULTANEOUS MULTI-SLICE RECORDING OF MAGNETIC RESONANCE DATA

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 70 days.

(21) Appl. No.: 15/977,213

(22) Filed: May 11, 2018

(65) Prior Publication Data

US 2018/0340995 A1  Nov. 29, 2018

(30) Foreign Application Priority Data

May 23, 2017 (DE) ......................... 10 2017 208 746

(51) Int. Cl.
*G01R 33/483* (2006.01)
*G01R 33/3875* (2006.01)
(Continued)

(52) U.S. Cl.
CPC ..... *G01R 33/4835* (2013.01); *G01R 33/4828* (2013.01); *G01R 33/543* (2013.01);
(Continued)

(58) Field of Classification Search
CPC ............ G01R 33/3875; G01R 33/4828; G01R 33/4835; G01R 33/5608; G01R 33/56572; G01R 33/4616
See application file for complete search history.

(56) References Cited

U.S. PATENT DOCUMENTS

2013/0285656 A1  10/2013  Feiweier
2014/0292333 A1  10/2014  Beck
(Continued)

FOREIGN PATENT DOCUMENTS

DE  102012205587 A1  10/2013
DE  102013205785 A1  10/2014
DE  102016214088 A1  2/2018

OTHER PUBLICATIONS

Schick, Fritz. "Simultaneous highly selective MR water and fat imaging using a simple new type of spectral-spatial excitation." Magnetic resonance in medicine 40.2 (1998): 194-202. (Year: 1998).*

(Continued)

*Primary Examiner* — Rishi R Patel
(74) *Attorney, Agent, or Firm* — Lempia Summerfield Katz LLC (57) ABSTRACT

A method for the simultaneous recording of magnetic resonance data relating to an examination subject from at least two different slices by a magnetic resonance sequence, wherein an excitation period of the magnetic resonance sequence that includes at least one sub-section that acts on only one of the slices, and that contains at least one high frequency pulse is used, wherein, to correct the main magnetic field inhomogeneities of the first order, for each slice affected by a sub-section, a correction parameter that modifies the gradient pulses that are to be emitted is determined, taking into account at least one main magnetic field map that describes the spatial distribution of the main magnetic field and a slice position of the affected slice and is applied in the emission of gradient pulses for the respective slice in the sub-section.

11 Claims, 5 Drawing Sheets

(51) Int. Cl.
  *G01R 33/48* (2006.01)
  *G01R 33/56* (2006.01)
  *G01R 33/565* (2006.01)
  *G01R 33/54* (2006.01)

(52) U.S. Cl.
  CPC ..... *G01R 33/5607* (2013.01); *G01R 33/5608* (2013.01); *G01R 33/56563* (2013.01); *G01R 33/56572* (2013.01); *G01R 33/3875* (2013.01)

(56) References Cited

U.S. PATENT DOCUMENTS

| | | |
|---|---|---|
| 2015/0115958 A1 | 4/2015 | Wang et al. |
| 2015/0218388 A1 | 8/2015 | Rupprecht et al. |
| 2015/0262464 A1 | 9/2015 | Goldenson |
| 2015/0355306 A1* | 12/2015 | Stemmer ............ G01R 33/543 324/309 |
| 2016/0313433 A1 | 10/2016 | Beck |
| 2017/0108567 A1 | 4/2017 | Bhat et al. |
| 2018/0024214 A1 | 1/2018 | Bhat et al. |
| 2018/0031652 A1 | 2/2018 | Paul et al. |
| 2018/0074146 A1 | 3/2018 | Bhat et al. |

OTHER PUBLICATIONS

Betsompop, Kawin, et al. "Blipped-controlled aliasing in parallel imaging for simultaneous multislice echo planar imaging with reduced g-factor penalty." Magnetic resonance in medicine 67.5 (2012): 1210-1224.

Barth, Markus, et al. "Simultaneous multislice (SMS) imaging techniques." Magnetic resonance in medicine 75.1 (2016): 63-81.

German Office Action for German Application No. 10 2017 208 746.3 dated Feb. 22, 2019.

Morrell, Glen, and Daniel Spielman. "Dynamic shimming for multi-slice magnetic resonance imaging." Magnetic resonance in medicine 38.3 (1997): 477-483.

Schmitter, Sebastian, et al. "Simultaneous multislice imaging in dynamic cardiac MRI at 7T using parallel transmission." Magnetic resonance in medicine 77.3 (2017): 1010-1020.

Sengupta, Saikat, et al. "Dynamic B0 shimming at 7 T." Magnetic resonance imaging 29.4 (2011): 483-496.

Wu, Xiaoping, et al. "Simultaneous multislice multiband parallel radiofrequency excitation with independent slice-specific transmit B1 homogenization." Magnetic resonance in medicine 70.3 (2013): 630-638.

* cited by examiner

SIMULTANEOUS MULTI-SLICE RECORDING OF MAGNETIC RESONANCE DATA

The application claims the benefit of German Patent Application No. DE 10 2017 208 746.3, filed May 23, 2017, which is hereby incorporated by reference in its entirety.

TECHNICAL FIELD

The disclosure relates to a method for the simultaneous recording of magnetic resonance data relating to an examination subject from at least two different slices by a magnetic resonance sequence, wherein an excitation period of the magnetic resonance sequence including at least one sub-section that acts on only one of the slices, containing at least one high frequency pulse, is used. The disclosure additionally relates to a magnetic resonance apparatus, a computer program, and an electronically readable data carrier.

BACKGROUND

Magnetic resonance (MR) imaging is a known technique with which images of the inside of an examination subject may be generated, e.g., of a patient in medical imaging. For this purpose, the examination subject is positioned in a magnetic resonance apparatus in a comparatively strong static, homogeneous main magnetic field, also known as the $B_0$-Feld, with field strengths of 0.2 tesla to 7 tesla and more, such that the nuclear spins thereof are orientated along the main magnetic field. To trigger nuclear magnetic resonances, high frequency excitation pulses (also known as RF-pulses) are radiated into the examination subject. The nuclear magnetic resonances that are triggered are measured as what is known as k-space data. On the basis thereof, MR images are reconstructed or spectroscopy data is acquired. For the spatial encoding of the magnetic resonance data, rapidly switched magnetic gradient fields are superimposed on the main magnetic field. The magnetic resonance data that has been recorded is digitalized and stored as complex numerical values in a k-space matrix. From the k-space matrix that is occupied by values, a relevant MR image may be reconstructed, for example, by a multi-dimensional Fourier transform.

The desire for faster and faster magnetic resonance images in the clinical environment is currently leading to a renaissance of methods in which magnetic resonance data from different volume regions of the examination subject, in particular therefore from different slices in a stack of slices, may be recorded simultaneously. These methods may be characterized in that, at least during a part of the measurement, transversal magnetization of at least two slices is used at the same time for the imaging process ("slice-multiplexing"; e.g., known in as simultaneous multi-slice (SMS) imaging). In conventional multi-slice imaging, the signal from at least two slices is recorded consecutively or alternately, that is, completely independent of each other, with an accordingly longer measurement time.

Known methods for this purpose are "Hadamard-coding", methods with simultaneous echo-refocusing, methods with broadband data recording or even methods that use parallel imaging in the slice direction. The latter methods also include, for example, the blipped Controlled Aliasing in Parallel Imaging (CAIPI) technique, as described by Setsompop et al. in "Blipped-Controlled Aliasing in Parallel Imaging for Simultaneous Multislice Echo Planar Imaging with Reduced g-Factor Penalty", Magnetic Resonance in Medicine 67, 2012, p. 1210-1224.

U.S. Patent Application Publication No. 2016/0313433 A1 and U.S. Patent Application Publication No. 2015/0115958 A1 disclose methods for simultaneous multi-slice measurement.

In such slice-multiplexing methods, what is known as a multiband high frequency pulse is used in order to excite or otherwise manipulate two or a plurality of slices at the same time, for example, to refocus or saturate them. Such a multiband high frequency pulse is, for example, a multiplex of individual single-slice high frequency pulses, which would be used for the manipulation of the slices that are to be manipulated at the same time. In order to be able to separate the resulting magnetic resonance signals from the various slices, each of the individual high frequency pulses is imprinted with a different phase, (e.g., prior to multiplexing), by adding a linear phase shift, for example, as a result of which the slices are shifted with respect to one another in the location domain. Through multiplexing, one obtains, for example, a basic band-modulated multiband high frequency pulse by adding the shapes of the pulses in the individual single-slice high frequency pulses.

As described, for example, in the article by Setsompop et al. cited above, the g-factor-related disadvantages may be reduced by shifts between the slices, by using gradient blips for instance or by modulating the phases of the individual high frequency pulses. As likewise disclosed in the cited article by Setsompop et al., the signals from the slices that have been excited or otherwise manipulated at the same time may first be combined like signals from only one slice in order for them to then be separated in the subsequent processing by a slice GeneRalized Auto-calibrating Partial Parallel Acquisition (GRAPPA) method.

In the prior art, it has also already been suggested in the context of slice-multiplexing to excite or manipulate in a different way different slices that are meant to be scanned at the same time, such that different contrasts emerge. In this context, U.S. Patent Application Publication No. 2017/0108567 A1 proposes a method for simultaneous multi-contrast recording in SMS imaging, in which with "inversion recovery", (IR) images may be acquired at the same time as non-IR images, by applying a single band inversion pulse to only one of the slices.

Likewise, with regard to saturation of certain types of spin, the Larmor frequencies of which differ due to a chemical shift, there are already relevant suggestions in existence. The types of spins possibly considered are spins of fat-bound protons ("fat spins") and spins of water-bound protons ("water spins"). A traditional measure adopted in this context is "fat saturation". In this context, the subsequently published U.S. Patent Application Publication No. 2018/0024214 discloses combining a binomial pulse for water excitation for a slice with a conventional excitation pulse for the other slice in order to acquire one slice with and one slice without fat saturation. The subsequently published U.S. Patent Application Publication No. 2018/0074146 proposes a method of spatial fat-suppression in multi-contrast SMS imaging, in which a pulse sequence acting on only one slice with a binomial pulse for fat excitation and a dephasing gradient are applied upstream of the further high frequency pulses in order to achieve fat saturation in said slice. The problem here is that the fat saturation may be inadequate in regions with strong B0 distortions. This is because, in those regions, the spins experience stronger or weaker dephasing because the gradient moment that is in fact acting on the spins is generated by the combination of the bipolar gradients and of the deviations in the main magnetic field.

Methods based on magnetic resonance, such as tomographic imaging (e.g., magnetic resonance tomography (MRT)) and spectroscopy (e.g., magnetic resonance spectroscopy (MRS)), may need "benign" physical environmental conditions in order to guarantee an optimum quality of the data acquired. For example, this applies to at least one of the criteria including spatial homogeneity, temporal stability, and the absolute accuracy of the magnetic fields relevant to MR methods ($B_0$, the stationary main magnetic field, and $B_1$, the high frequency magnetic field).

Already known methods with which deviations from ideal environmental conditions may be at least partly compensated for include both system-specific adjustments that seek to correct the given parameters of the magnetic resonance apparatus used, such as for example, eddy current-induced dynamic field distortions or likewise gradient sensitivities, and also examination subject-specific adjustments that attempt to compensate for the changes caused by putting the examination subject, (e.g., a patient), into the measurement volume of the magnetic resonance apparatus, such as susceptibility-related static field distortions or spatial variations in the high frequency field, for instance. To compensate for non-ideal environmental conditions, the affected parameters of the magnetic resonance sequences may be adjusted. In particular, parameters that come into consideration here are the respective central excitation frequency (for example, for an improved fat-suppression and/or a reduced EPI image shift), shimming of the B0 field in the first order (for example, for more homogeneous fat-suppression and/or an improved signal-noise ratio (SNR)), a respective electric voltage of each of the high frequency transmission units (for example, for an improved SNR) and/or B1-shimming (for example, for a more homogeneous SNR). Such examination subject-specific parameters may be derived, for example, from B0 field maps or B1 field maps that have been drawn beforehand.

An adjustment of these recording parameters was first described only for coherent volumes and not, for example, for unconnected slices such as those that are excited or manipulated at the same time in slice-multiplexing. Because the slices to be manipulated at the same time in the slice-multiplexing method are normally arranged as far apart from each other as possible in order to make it easier to separate the slices into signals later, with these methods, an optimization volume in which deviations in the environmental conditions may be corrected therefore includes either the entire stack of slices or at least the envelope of the slices that are to be manipulated at the same time. The parameters included therein are therefore only adjusted on average for the optimization volume and may even be randomly unsuitable for the slices that are actually affected. In particular with measurements on regions of the examination subject with spatially rapidly varying environmental conditions, such as in the region of the patient's head, such adjustments of recording parameters averaged out over fairly large volumes may even lead to the result worsening.

The subsequently published German Patent Application Publication No. DE 10 2016 214 088.4, which has been incorporated in its entirety into the disclosure content of the present description, discloses in this context a method for the slice-specific adjustment of RF pulses in recordings of magnetic resonance data relating to an examination subject with the aid of a slice-multiplexing method in which, for each slice that is to be scanned at the same time, single-slice RF pulse parameters are determined on the basis of the slice position, the single-slice RF pulse parameters are corrected on the basis of at least one examination subject-specific parameter map (e.g., B0 map and/or B1 map), which in each case shows the spatial distribution of one system parameter in the examination subject and of the slice position are corrected and a multi-band RF pulse for the manipulation of the slices to be scanned at the same time is generated on the basis of the corrected single-slice RF pulse parameters. Here, parameters to be adjusted relate to the central-excitation frequency, an amplitude-scaling factor (e.g., transmitter voltage) and/or B1 shim parameters. A correction relating to terms of the first order in the main magnetic field is not possible by the high frequency pulses, so that only the aforementioned averaged correction that considers all the slices measured together is suggested there.

This is particularly problematic with regard to different contrasts and the approaches to fat saturation described in the aforementioned because it has transpired that B0 field deviations of the first order are the main reason for a non-homogeneous fat saturation and other inhomogeneous contrasts.

SUMMARY AND DESCRIPTION

The scope of the present disclosure is defined solely by the appended claims and is not affected to any degree by the statements within this summary. The present embodiments may obviate one or more of the drawbacks or limitations in the related art.

The disclosure addresses the problem of providing an option for improving the quality of the magnetic resonance data in multi-contrast slice multiplexing imaging.

In a method, provision is therefore made to correct main magnetic field inhomogeneities of the first order for each slice affected by a sub-section such that a correction parameter that modifies the gradient pulses that are to be emitted is determined, taking into account at least one main magnetic field map that describes the spatial distribution of the main magnetic field and a slice position of the affected slice and that said parameter is applied in the emission of gradient pulses for the respective slice in the sub-section.

Use is made of the fact that sub-sections of the excitation module of the magnetic resonance sequence completed in the excitation period relate only to specific slices and therefore slice-specific corrections relating to the deviations of first order in the main magnetic field may be carried out, which corrections would not be possible and therefore have not been considered until now in the prior art in the event that all the slices that are to be acquired are influenced simultaneously. In this way, the present disclosure therefore specifically discloses a B0-gradient shimming method of the first order for an improved image data quality in general and an improved contrast homogeneity, (e.g., a fat saturation homogeneity), which method may be applied to multi-contrast SMS imaging. With regard to the selective excitation and/or suppression of specific types of spin in only one of the slices that are to be scanned simultaneously, use is made of the fact that the suppression- or excitation modules (e.g., pulse sequences) at least partly target only one single, specific slice. Altogether, it is pointed out that the term "excitation period" is to be interpreted broadly and is also intended to include the emission of high frequency pulses that have a manipulative effect on at least one slice, for example, refocusing pulses and suchlike. In particular, the sub-section may also cover relaxation periods in only one slice.

It has transpired that, through the method, a clear increase in the quality of the magnetic resonance data recorded in this way is provided because the correction ensues directly in sensitive parts of the magnetic resonance sequence that until now had a negative effect if, for example, they were subjected to an overall correction. Precisely with regard to selective excitation or selective suppression of types of spin, for example, of fat spins and/or water spins, the homogeneity of the selective excitation/suppression may be improved, which is crucial for the overall quality of the multi-contrast magnetic resonance data.

In concrete terms, provision may be made for a gradient offset that is to be applied as a correction parameter to a slice selection gradient to be determined. Basic options for B0 shimming of the first order by adjusting gradient pulses have already been described in the prior art and may also be used accordingly in the context of the present disclosure. What is particularly easy to implement is the use of gradient offsets at least in the at least one slice selection direction.

It should be further mentioned at this point that, during an overall multi-contrast SMS imaging procedure, a plurality of slice combinations may be recorded consecutively. Here the method provides a dynamic adjustment of the correction parameters depending on the slices that are currently to be recorded/are affected in order to allow an optimum dynamic readjustment/correction.

A further development makes provision such that, for high frequency pulses and/or sub-pulses acting on a plurality of slices including remaining sections of the excitation period, a correction parameter is likewise determined and applied jointly in each case for all the affected slices. While it is possible therefore to carry out no corrections at all in the remaining sections with regard to deviations of the first order in the main magnetic field, it may be useful in at least some of the potential scenarios to jointly consider a plurality of slices affected and therefore manipulated at the same time and to likewise find a correction solution in this case too, which solution may relate, for example, to the entire stack of slices, but also to a volume that envelops the slices affected by the relevant residual section. The remaining sections may be understood as multi-band excitation modules or manipulation modules, which indeed cannot be optimized in a slice-specific manner but may be used for the averaged correction parameters, as is basically known in the prior art. All the same, it is pointed out that less of an improvement is expected here, (e.g., also with regard to a shimming of a selection module), according to which the main advantage is the more homogeneous contrasts, which are already achieved, however, by the correction in the sub-sections.

In order to achieve a further improvement, provision may be made such that for each slice, single slice high frequency pulse parameters that describe single slice pulses of the excitation period affecting said slice are determined on the basis of the slice position and are corrected taking into account the main magnetic field map and/or a high frequency field map, which describes the spatial distribution of the high frequency field, and the respective slice position, wherein the high frequency pulses that are to be emitted in the excitation period are determined on the basis of the corrected single-slice high frequency pulse parameters. Therefore, in addition to the slice-specific B0-shimming by gradient correction in the sub-sections that is provided, the slice-specific correction that is applicable over the entire excitation period, as described in the subsequently published German Patent Application Publication No. DE 10 2016 214 088.4, may advantageously also be used. The description in that document accordingly likewise continues to be applicable accordingly within the context of the present disclosure. In particular therefore, a central excitation frequency and/or an amplitude scaling factor and/or a B1 shim parameter may be used as single-slice high frequency pulse parameters. Through this correction of the single-slice high frequency pulse parameters on the basis of at least one examination subject-specific main magnetic field map (e.g., B0 map) and/or examination subject-specific high frequency field map (e.g., B1 map), the single-slice high frequency pulse parameters may be adjusted to currently prevalent environmental conditions. Through the generation of multiband high frequency pulses on the basis of the already corrected single slice high frequency pulse parameters, the resulting multiband high frequency pulses are themselves adjusted in a slice-specific manner to the current environmental conditions, such that already slice-specifically adjusted single-slice high frequency pulses may be combined by multiplexing into what are then likewise slice-specifically adjusted multiband high frequency pulses, as a result of which a further quality improvement in the magnetic resonance data is achieved in each case in a slice-accurate manner, in particular with regard to the signal-to-noise ratio, the homogeneity of the signal-to-noise ratio and also the contrast homogeneity, in particular in fat-suppression. To generate the multiband high frequency pulse, corresponding single-slice high frequency pulses may be added together, and it is also conceivable for a gradient moment-based Maxwell term correction method to be used.

It should be further mentioned at this point that it is not the intention in the present application to go into further detail about the selection of the slice positions of the slices that are to be scanned simultaneously because a very wide range of options has already been discussed in the prior art, which of course may also be applied accordingly within the context of the present disclosure.

A further development makes provision such that, in the sub-section, a pulse sequence serving to saturate or excite spins of a particular spin type in the affected slice is emitted, in particular including a frequency-selective binomial pulse and/or a subsequent dephasing gradient pulse. The procedure described here may therefore be particularly advantageously applied to specific, slice-specific excitation and/or suppression modules that may be emitted before further high frequency pulses that act on a plurality of slices. A suppression module for a type of spin, (e.g., fat spins), may include a pulse sequence in which fat spins are first excited selectively in the affected slice in order to then be specifically dephased by a dephasing gradient. For further detail, reference is made here to the aforementioned subsequently published U.S. Patent Application Publication No. 2018/0074146. In the context of the present disclosure, such a suppression module is optimized with respect to the affected specific slice, taking into account the environmental conditions, and therefore a particularly homogeneous suppression is achieved; the same may of course apply with regard to a selective excitation module used as a pulse sequence.

Additionally, or alternatively, it is conceivable that at least one binomial pulse that includes sub-pulses acting on only one slice is used as a high frequency pulse, wherein the sub-pulses acting on only one slice define the sub-section. Likewise, in a procedure described for example, in the subsequently published U.S. Patent Application Publication No. 2018/0024214, the disclosure may therefore be usefully employed to improve the quality of the magnetic resonance data. For example, such a combined binomial pulse may be used for the simultaneous water excitation for a first slice and to excite both fat and water for a second slice. Specific sub-pulses of the binomial pulse are directed here only at the first slice, where the excitation of fat spins is to be suppressed, such that for these sub-pulses, slice-specific correction parameters may be used for the corresponding gradient pulses. For sub-pulses that affect both or all the slices, the correction may be omitted, or as described above, an averaged correction parameter, (e.g., gradient offset), may be applied. The majority of the period of time in which the phase evolution for fat spins and water spins occurs in the first slice is, however, covered by the slice-specific correction of main magnetic field inhomogeneities of the first order, such that a clear improvement in the quality of the fat saturation occurs.

In addition to the method, the present disclosure also relates to a magnetic resonance apparatus, including a control apparatus that is embodied to carry out the method disclosed herein. In particular, alongside sequence control units potentially provided for running a magnetic resonance sequence, the control apparatus may also include a correction unit, in which the correction parameter may be determined as described, and a corresponding dynamic readjustment or adjustment of the magnetic resonance sequence may ensue. A further correction unit may be used, as described, to implement the correction method disclosed in German Patent Application Publication No. DE 10 2016 214 088.4, which suppresses single-slice high frequency pulses. All the statements made with reference to the method may likewise be applied to the magnetic resonance apparatus, with which the advantages already referred to may therefore likewise be achieved.

A computer program is, for example, able to be loaded directly into a memory of a control device of a magnetic resonance apparatus and has programming mechanisms in order to implement the acts of the method when the computer program is run in the control apparatus of a magnetic resonance apparatus, by a processor, for example. The computer program may be stored on an electronically readable data carrier, which therefore includes electronically readable control data that is stored thereon, which includes at least one named computer program and are embodied such that, when the data carrier is used in a control apparatus of a magnetic resonance apparatus, the data may run the method. The data carrier may be a non-transient data carrier, (e.g., a CD-ROM).

BRIEF DESCRIPTION OF THE DRAWINGS

Further advantages and details of the present disclosure will emerge from the exemplary embodiments that are described below and from the drawing, in which.

DETAILED DESCRIPTION

Figure 1:
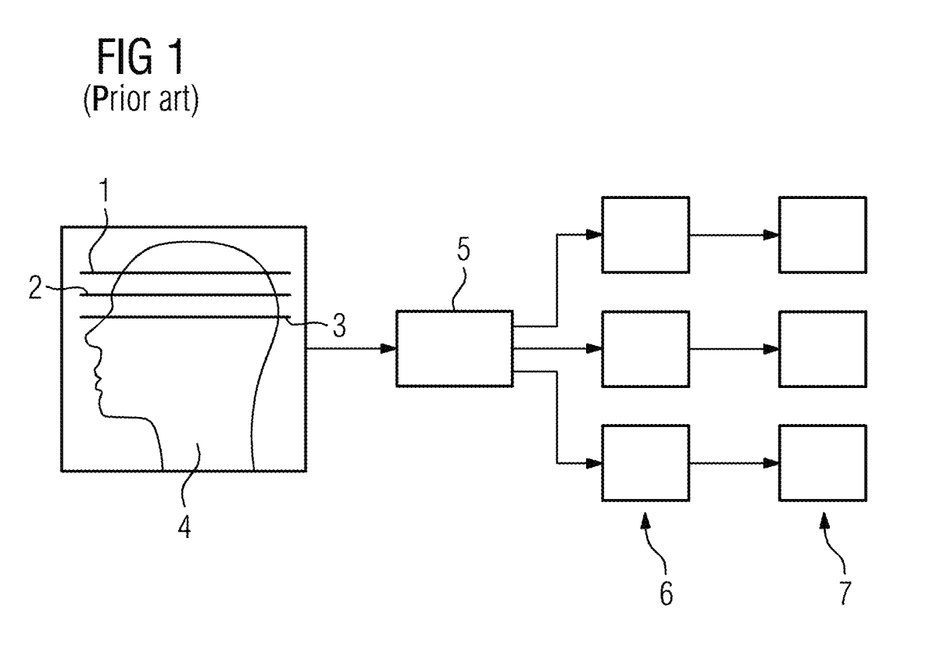
FIG. 1 depicts an example of a schematic flow diagram explaining SMS imaging.

To explain the background to the present disclosure, FIG. 1 depicts a workflow of a slice-multiplexing imaging procedure (e.g., SMS imaging procedure) with a magnetic resonance apparatus. Here, at least two slices 1, 2, 3 are first excited at the same time in an examination subject 4, in this case a patient's head, and the resulting magnetic resonance signals are acquired simultaneously as magnetic resonance data from each of slices 1 to 3. The result of this act is a data set in k-space, which set includes magnetic resonance data from the plurality of slices 1, 2, 3 superimposed one over the other. For acquisition, in act 5 the Blipped Controlled Aliasing in Parallel Imaging Results in Higher Acceleration (CAIPIRINHA) technique is used, as explained, for example, in the article by Setsompop et al. referenced above.

The magnetic resonance data that has been recorded in this way is separated into the various slices in acts 6 by a slice GRAPPA algorithm, it being possible to add further acts 7 onto the acts 6 for each of slices 1, 2, 3 in order to apply an in-plane GRAPPA algorithm, if an in-plane acceleration is available at all. This results in magnetic resonance images for the individual slices 1, 2, 3.

Figure 2:
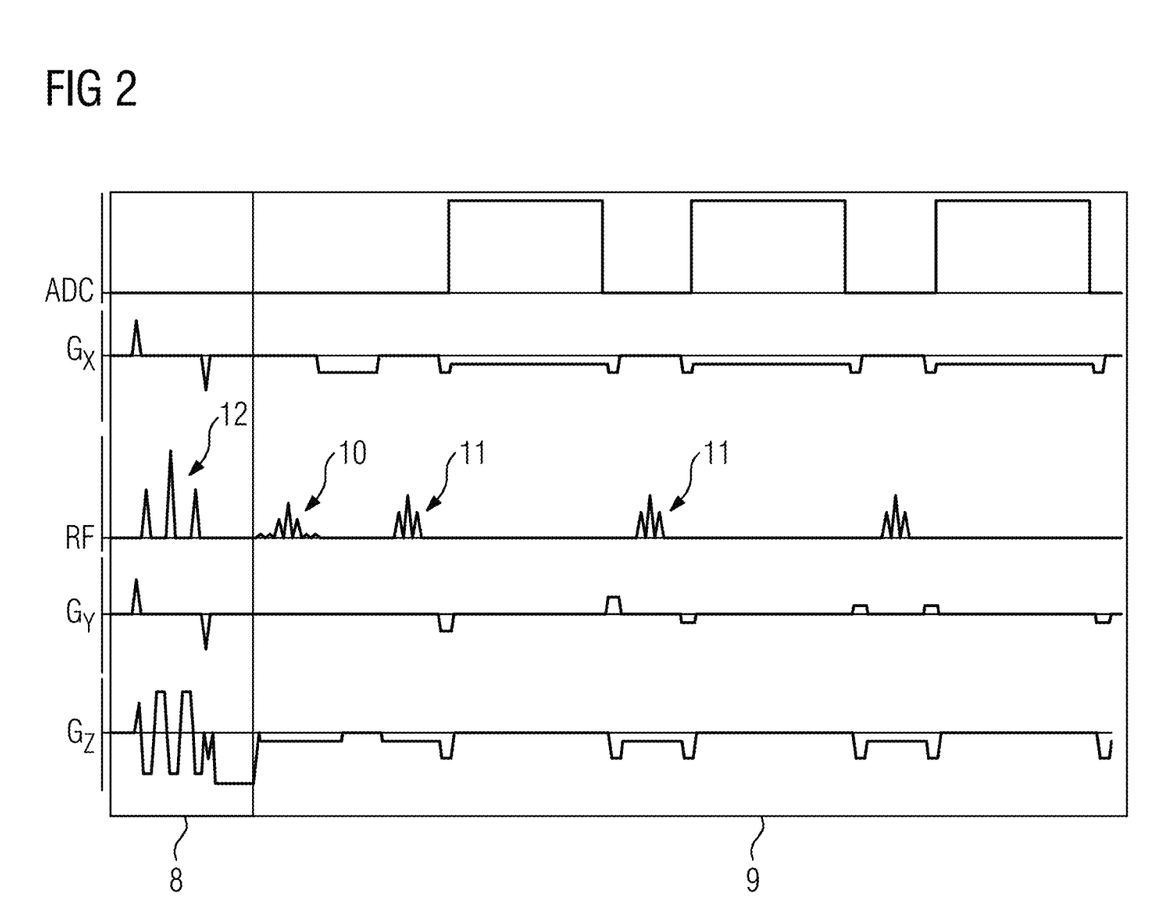
FIG. 2 depicts an example of a basic sequence diagram to be used.

FIG. 2 depicts a sequence diagram for a magnetic resonance sequence for multi-contrast SMS imaging, in which the procedure that is explained below may be used. The sequence diagram 2 clearly includes consecutive time sections, that is, a fat saturation module 8 (e.g., fat saturation pulse sequence) that acts on a first slice and a conventional Turbo Spin Echo (TSE) module 9, which relates to all the slices 1, 2, 3 that are to be scanned at the same time, the high frequency pulses of which 10, 11 therefore act on all the slices 1, 2, 3 that are to be scanned at the same time. The high frequency pulse 10 is a multiband excitation pulse, and the high frequency pulses 11 are multiband refocusing pulses.

Figure 3:
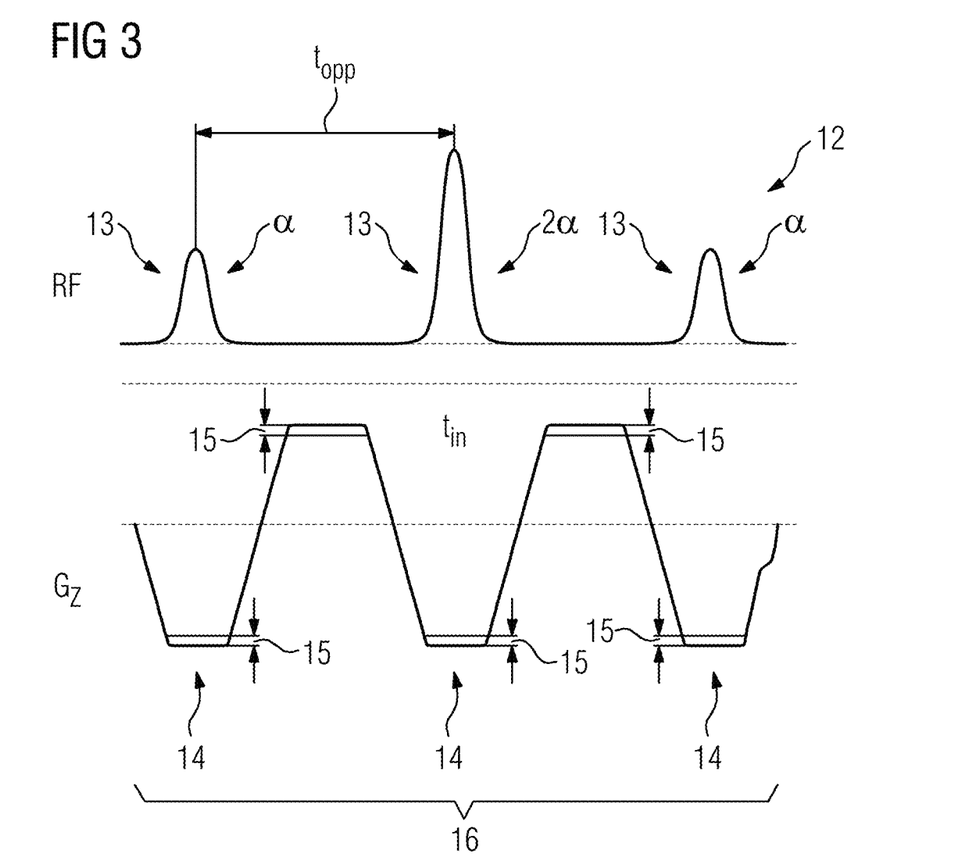
FIG. 3 depicts a sub-section of the excitation period according to FIG. 2.

FIG. 3 depicts parts of the saturation module 8 in closer detail, that is, the high frequency pulse component (RS) and the slice detection gradient component ($G_z$). It is clear that in the present case a 1-2-1 binomial pulse 12 is used, which pulse includes three sub-pulses 13. The gap between the sub-pulses 13 is selected as a function of the chemical shift between fat spins and water spins as spin types such that only fat spins are excited by the binomial pulse 12 as a high frequency pulse, after the transversal magnetization of the water spins has been rotated into the opposite direction by the second sub-pulse 13 (2a) and therefore returns to zero again due to the final sub-pulse. Here, the binomial pulse 12 acts only on one of the plurality of slices 1, 2, 3 due to the slice selection gradient pulse 14.

Prior to emitting the gradient pulses 14, in the context of the exemplary embodiment of the method that is used here, a determination of correction parameters to correct main field inhomogeneities of the first order has already been carried out for the slice, and indeed on the basis of the known position of the affected slice, that is, based on the slice position, and a main magnetic field map (e.g., B0 map), which has been acquired in an examination subject-specific manner and therefore describes the actual examination subject-specific environmental conditions. In the present case, gradient offsets 15 to be applied to the slice selection gradient $G_z$ have been determined as correction parameters. These are also applied accordingly, as depicted in FIG. 3, such that the main magnetic field inhomogeneities of the first order for the affected slice may be corrected accordingly. The part of the excitation period depicted in FIG. 3 may therefore be understood as a sub-section 16, in which the high frequency pulses (e.g., the binomial pulse 12) act only on a single slice of all the slices 1, 2, 3 that are to be scanned at the same time.

For the remaining sections of the excitation period, therefore for the emission of the high frequency pulses 10, 11 (cf. FIG. 2), either no such correction is applied in the case of the gradient pulses or, however, an averaged correction is applied, which relates to a volume that encompasses all the slices 1, 2, 3 that have been excited or manipulated at the same time.

It should be further mentioned at this point that a continuous further slice-specific correction does exist, which relates to the high frequency pulses 10, 11 and to the binomial pulse 12. This is because, for each slice, in the present exemplary embodiment, single-slice high frequency pulse parameters that describe single-slice pulses of the excitation period affecting said slice have been determined on the basis of the slice positions and have then been corrected, taking into account the aforementioned main magnetic field map and a high frequency field map (e.g., B1 map) that describes the spatial distribution of the high frequency field and also the respective slice position. The high frequency pulses 10, 11, 12 that were actually to be emitted in the excitation period have then been determined on the basis of the corrected single-slice high frequency pulse parameters. In the present case, a central excitation frequency, an amplitude scaling factor, and a B1 shimming parameter have been used as single-slice high frequency pulse parameters.

Figure 4:
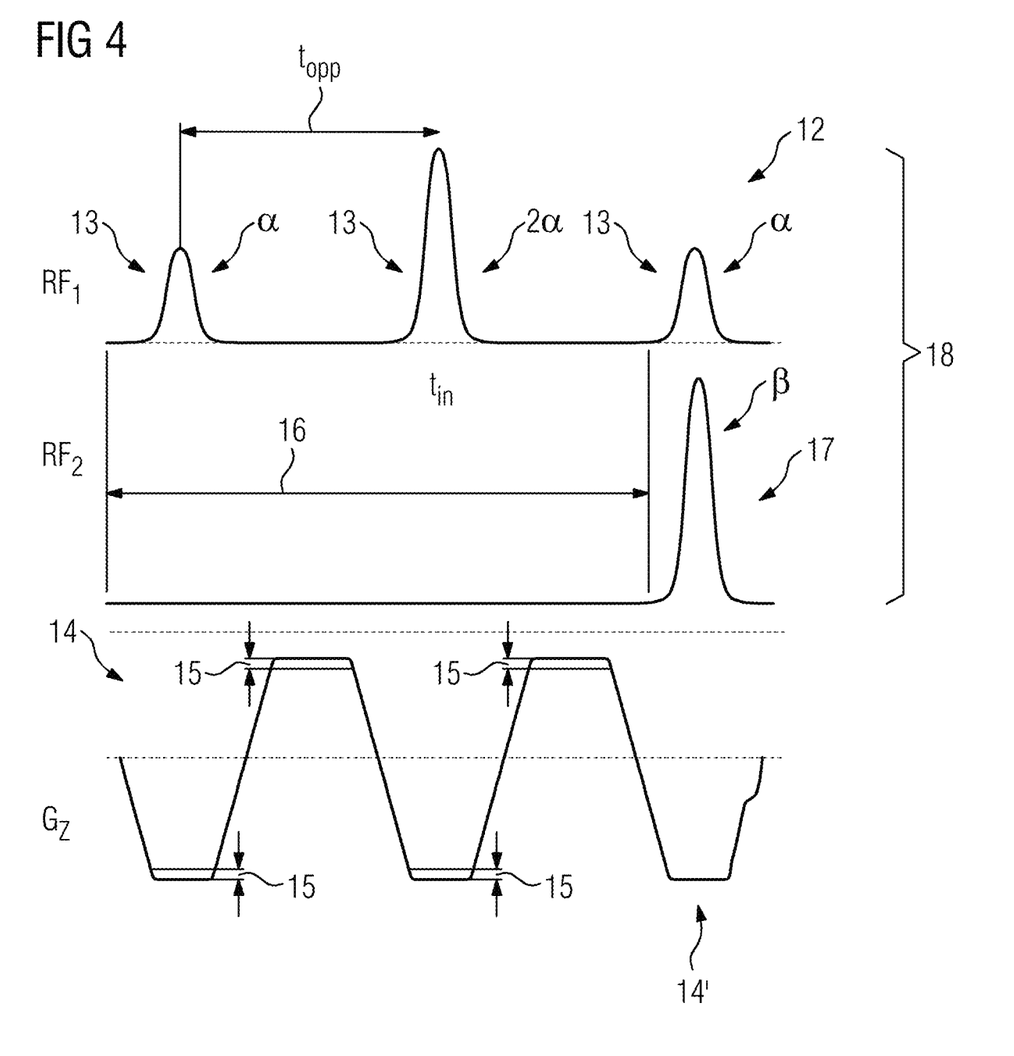
FIG. 4 depicts a section from a further sequence diagram to explain a further example of a use.

FIG. 4 depicts a further exemplary embodiment, in which the procedure finds application. In that case, a binomial pulse 12 that is to be applied to a first slice 1, 2, 3 in turn includes three sub-pulses 13. The last sub-pulse 13 is intended to be emitted superimposed with a single-slice high frequency pulse 17, such that overall a multi-band high frequency pulse 18 is generated. The sub-pulses 13 and the single-slice high frequency pulse 17 for both slices are phase-modulated and added together in order to obtain the multi-band high frequency pulse 18. It is clear that, in the present exemplary embodiment, the correction of the slice selection gradient pulses 14, that is the gradient offset 15, is only applied for as long as only one slice, in this case the first slice, is affected (sub-section 16). However, as soon as both slices are affected, gradient pulse 14', in the present case no correction is applied; alternatively, an averaged correction that is valid for both slices may be used.

It is further pointed out that, in the second exemplary embodiment in FIG. 4, the binomial pulse 12 provides that only water is excited for the first slice, yet fat and water alike are excited for the second slice.

In this way, the specific correction of the gradient pulses 14 for the first slice, which is affected by the first two sub-pulses 13, is active for the majority of the water excitation phase, such that the fat-suppression homogeneity shows a clear improvement. The sub-section 16 only ends when an overall pulse affecting both slices is emitted.

Figure 5:
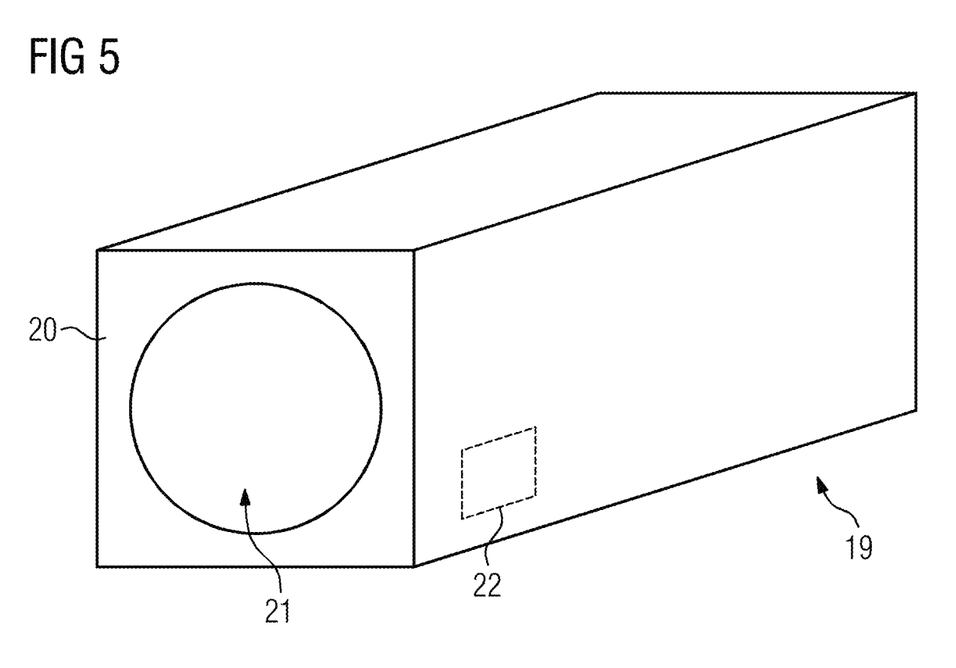
FIG. 5 depicts an example of a magnetic resonance apparatus.

FIG. 5 finally depicts a sketch illustrating the principle of a magnetic resonance apparatus 19. As is basically known, this has a main magnet unit 20, in which a patient recess 21 is embodied, into which a patient may be taken for imaging as an examination subject 4. Basic known components of the magnetic resonance apparatus 19, (e.g., a gradient coil arrangement, a high frequency coil arrangement, a patient couch, and the like), are not shown in greater detail for reasons of clarity.

The operation of the magnetic resonance apparatus 19 is controlled by a control device 22, which is also embodied to carry out the method. For this purpose, the control device 22 may also include, in addition to at least one sequence control unit, at least one correction unit to determine and apply the correction parameters.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for simultaneous recording of magnetic resonance data relating to an examination subject from at least two different slices by a magnetic resonance sequence, wherein the magnetic resonance sequence comprises an excitation period, wherein the excitation period includes at least one sub-section, wherein the at least one sub-section is a period of time that acts on only one slice of the at least two different slices, and wherein the excitation period of the magnetic resonance sequence contains at least one high-frequency pulse, the method comprising:
   determining, for each slice affected by a sub-section, a correction parameter that modifies gradient pulses to be emitted, wherein the determining of the correction parameter takes into account at least one main magnetic field map that describes a spatial distribution of a main magnetic field and a slice position of the affected slice;
   applying the correction parameter in an emission of the gradient pulses for the respective slice in the sub-section to correct main magnetic field inhomogeneities of a first order; and
   simultaneously recording the magnetic resonance data from the at least two different slices by the magnetic resonance sequence.

2. The method of claim 1, further comprising:
   determining a gradient offset to be applied to a slice selection gradient as the correction parameter.

3. The method of claim 2, further comprising:
   determining a correction parameter for each slice in each remaining section of the excitation period that include high frequency pulses and/or sub-pulses acting on a plurality of slices and applying the correction parameter in each case for all the affected slices.

4. The method of claim 1, further comprising:
   determining a correction parameter for each slice in each remaining section of the excitation period that include high frequency pulses and/or sub-pulses acting on a plurality of slices and applying the respective correction parameter in each case for all the affected slices.

5. The method of claim 1, wherein, for each slice, single-slice high frequency pulse parameters that describe single-slice pulses of the excitation period affecting the respective slice are determined based on the slice positions and are corrected taking into account the main magnetic field map and/or a high frequency field map that describes the spatial distribution of the high frequency field and the respective slice position, and
   wherein the high frequency pulses to be emitted in the excitation period are determined based on the corrected single-slice high frequency pulse parameters.

6. The method of claim 5, wherein a central excitation frequency, an amplitude scaling factor, a B1-shimming parameter, or a combination thereof are used as single-slice high frequency pulse parameters.

7. The method of claim 1, further comprising:
emitting, in the sub-section, a pulse sequence serving to saturate or excite spins of a particular spin type in the affected slice.

8. The method of claim 7, wherein the pulse sequence comprises a frequency-selective binomial pulse, a subsequent dephasing gradient pulse, or a combination thereof.

9. The method of claim 1, wherein at least one binomial pulse that includes sub-pulses that act on only one slice is used as a high frequency pulse, and
wherein the sub-pulses that act on only one slice define the sub-section.

10. A magnetic resonance apparatus comprising:
a control apparatus configured to:
determine, for each slice affected by a sub-section of an excitation period of a magnetic resonance sequence, a correction parameter that modifies gradient pulses to be emitted taking into account at least one main magnetic field map that describes a spatial distribution of a main magnetic field and a slice position of each affected slice;
apply the correction parameter in an emission of the gradient pulses for the respective slice in the sub-section to correct main magnetic field inhomogeneities of a first order; and
simultaneously record magnetic resonance data from at least two different slices by the magnetic resonance sequence,
wherein the excitation period of the magnetic resonance sequence includes the sub-section,
wherein the sub-section is a period of time that acts on only one slice of the at least two different slices, and
wherein the excitation period contains at least one high-frequency pulse.

11. A non-transitory electronically readable data carrier comprising:
at least one computer program configured to cause a magnetic resonance apparatus to at least perform:
determine, for each slice affected by a sub-section of an excitation period of a magnetic resonance sequence, a correction parameter that modifies gradient pulses to be emitted taking into account at least one main magnetic field map that describes a spatial distribution of a main magnetic field and a slice position of each affected slice;
apply the correction parameter in an emission of the gradient pulses for the respective slice in the sub-section to correct main magnetic field inhomogeneities of a first order; and
simultaneously record magnetic resonance data from at least two different slices by the magnetic resonance sequence,
wherein the excitation period of the magnetic resonance sequence includes the sub-section,
wherein the sub-section is a period of time that acts on only one slice of the at least two different slices, and
wherein the excitation period contains at least one high-frequency pulse.

* * * * *